(12) United States Patent
Cheng et al.

(10) Patent No.: US 10,351,417 B2
(45) Date of Patent: Jul. 16, 2019

(54) MEMS DEVICE WITH VIEWER WINDOW AND MANUFACTURING METHOD THEREOF

(71) Applicant: TAIWAN SEMICONDUCTOR MANUFACTURING COMPANY LTD., Hsinchu (TW)

(72) Inventors: Chun-Wen Cheng, Hsinchu County (TW); Chi-Hang Chin, New Taipei (TW); Jung-Huei Peng, Hsinchu Hsien (TW); Chia-Hua Chu, Hsinchu County (TW); Shang-Ying Tsai, Taoyuan County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 15/687,904

(22) Filed: Aug. 28, 2017

(65) Prior Publication Data
US 2019/0062151 A1 Feb. 28, 2019

(51) Int. Cl.
B81B 7/00 (2006.01)
B81C 1/00 (2006.01)

(52) U.S. Cl.
CPC ........ *B81B 7/0067* (2013.01); *B81C 1/00269* (2013.01); *B81B 7/007* (2013.01); *B81B 7/0038* (2013.01); *B81B 2201/0235* (2013.01); *B81B 2201/0242* (2013.01)

(58) Field of Classification Search
None
See application file for complete search history.

(56) References Cited

U.S. PATENT DOCUMENTS

| 6,627,814 | B1* | 9/2003 | Stark | B81B 7/0067 174/539 |
| 6,809,413 | B1* | 10/2004 | Peterson | B81B 7/0067 257/680 |
| 2004/0232535 | A1* | 11/2004 | Tarn | B81C 1/00269 257/680 |
| 2010/0019340 | A1* | 1/2010 | Shibayama | H01L 27/14618 257/434 |
| 2010/0103389 | A1* | 4/2010 | McVea | B81B 7/0077 353/99 |
| 2016/0016791 | A1* | 1/2016 | Jacobs | B81C 1/00595 257/437 |

* cited by examiner

*Primary Examiner* — Lex H Malsawma
(74) *Attorney, Agent, or Firm* — WPAT, P.C., Intellectual Property Attorneys; Anthony King

(57) ABSTRACT

A semiconductor device includes a first substrate, a second substrate bonded to the first substrate from a first surface of the second substrate, a third substrate bonded to the second substrate from a second surface of the second substrate, a cavity defined by the first substrate, the second substrate and the third substrate; and a viewer window provided in the third substrate and aligned with the cavity; wherein the inside of the cavity is observed through the viewer window.

20 Claims, 11 Drawing Sheets

MEMS DEVICE WITH VIEWER WINDOW AND MANUFACTURING METHOD THEREOF

BACKGROUND

Electronic equipment involving semiconductive devices are essential for many modern applications. The semiconductive device has experienced rapid growth. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

Micro-electro mechanical system (MEMS) devices have been recently developed and are also commonly involved in electronic equipment. The MEMS device is micro-sized device, usually in a range from less than 1 micron to several millimeters in size. The MEMS device includes mechanical and electrical features formed by one or more semiconductor manufacturing processes. The MEMS device includes fabrication using semiconductive materials to form mechanical and electrical features. For many applications, MEMS device is electrically connected to external circuitry to form complete MEMS systems. Commonly, the connections are formed by wire bonding. The MEMS device may include a number of elements (e.g., stationary or movable elements) for achieving electro-mechanical functionality. MEMS devices are widely used in various applications. MEMS applications include pressure sensors, printer nozzles, or the like. Moreover, MEMS applications are extended to optical applications, such as movable mirrors, and radio frequency (RF) applications, such as RF switches or the like.

Conventionally, MEMS devices are bonded with opaque silicon substrate such that any optics application or optical observation is not allow. In addition, to do a failure analysis (FA) or additional device analysis, the de-cap process is needed and the de-cap process usually accompanies with particles. For example, the stiction phenomenon may recover during the de-cap process. As a result, these MEMS devices are capped by utilizing top transparent substrate, for example glass substrate, such that these devices in integrated chips can be easily monitored. Therefore, there is a continuous need to modify structure and manufacturing method of the MEMS devices in order to improve the device performance as well as reduce manufacturing cost and processing time.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
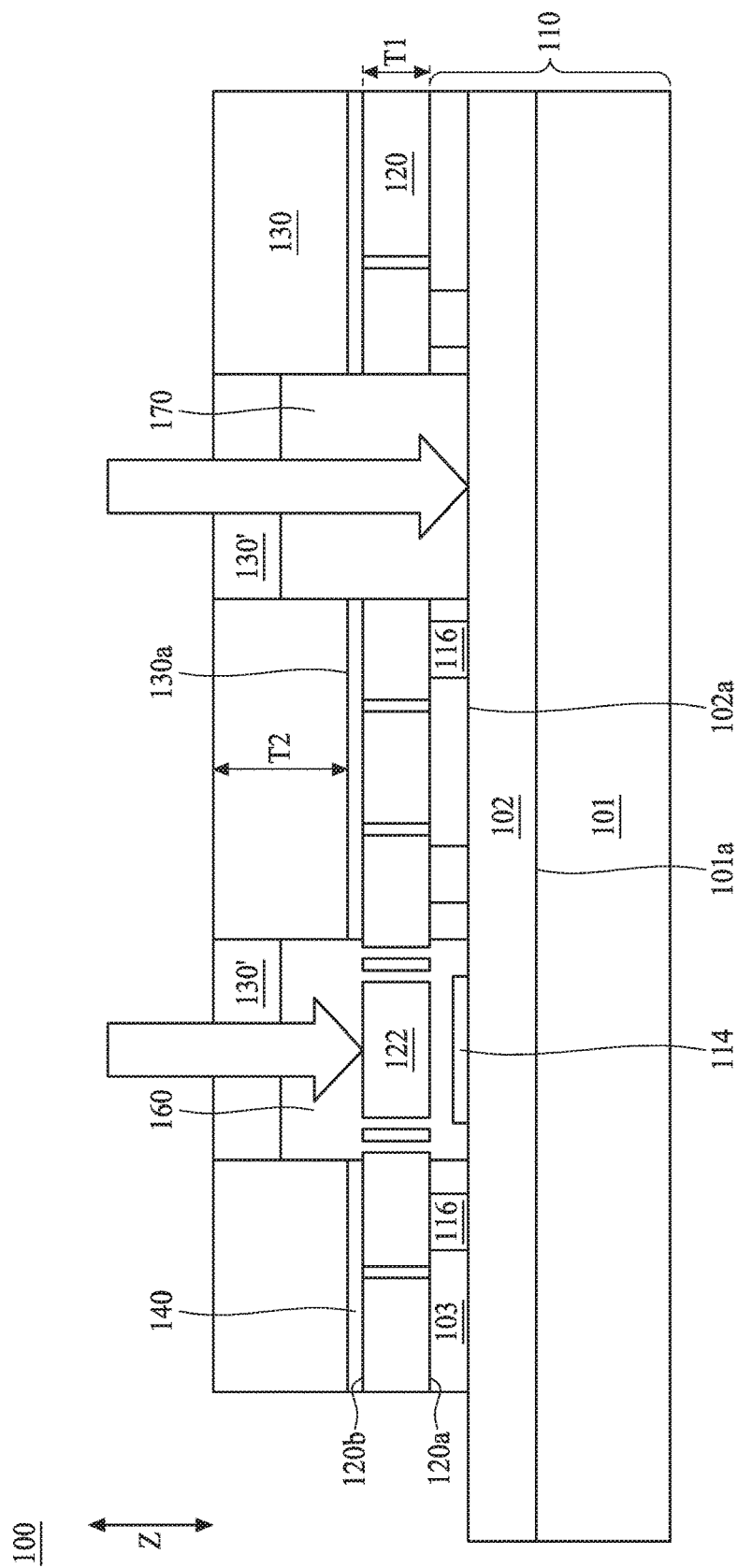
FIG. 1 is a schematic cross-sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first" and "second" describe various elements, compounds, regions, layers and/or sections, these elements, components, regions, layers and/or sections should not be limited by these terms. These terms may be only used to distinguish one element, component, region, layer or section from another. The terms such as "first" and "second" when used herein do not imply a sequence or order unless clearly indicated by the context.

As used herein, the term "substantially" refers to the complete or nearly complete extent or degree of an action, characteristic, property, state, structure, item, or result. For example, a surface that is "substantially" coplanar with another surface would mean that these two surfaces are either completely located in the same plane or nearly completely located in the same plane. The exact allowable degree of deviation from absolute completeness may in some cases depend on the specific context. However, generally speaking the nearness of completion will be so as to have the same overall result as if absolute and total completion were obtained.

As used herein, multiple MEMS devices can be integrated onto a semiconductive substrate in recent generation of MEMS applications. For example, motion sensors are used for motion-activated user interfaces in consumer electronics such as smartphones, tablets, gaming consoles, smart-TVs, and in automotive crash detection systems. To capture a complete range of movements within a three-dimensional space, motion sensors often utilize an accelerometer and a gyroscope in combination. The accelerometer detects linear movement, and the gyroscope detects angular movement. To meet consumer's demand for low cost, high quality, and small device footprint, the accelerometer and the gyroscope can be formed from MEMS devices, which are integrated together on a same substrate by same manufacturing processes. However, the accelerometer and the gyroscope utilize different operating conditions. For example, an accelerometer requires an enclosure with greater pressure while a gyroscope requires an enclosure with lower pressure. In some embodiments, a pressure in the enclosures of a gyroscope is less than or equal to 0.001 millibar (mbar).

Therefore, the present disclosure is directed to a semiconductor structure including multiple MEMS devices that are integrated on a substrate. The semiconductor structure includes a first substrate comprising an integrated circuit device formed thereon. The semiconductor structure includes a second substrate comprising at least one of device formed thereon. The second substrate is bonded to the first substrate from a first surface of the second substrate. The semiconductor structure includes a third substrate disposed on the second substrate and bonded to the second substrate from a second surface of the second substrate. In addition, the semiconductor structure further includes a cavity defined by the first substrate, the second substrate and the third substrate. The semiconductor structure further includes a viewer window provided in the third substrate and aligned with the cavity and the inside of the cavity is observed through the viewer window.

FIG. 1 illustrates a schematic cross-sectional view of a semiconductor structure 100 in accordance with some embodiments of the present disclosure. In FIG. 1, the semiconductor structure 100 includes a first substrate 110, a second substrate 120, and a third substrate 130. In some embodiments, the semiconductor structure 100 further includes at least one cavity such as a first cavity 160 or a second cavity 170. In some embodiments, the semiconductor structure 100 further includes a viewer window 130' provided in the third substrate 130 and aligned with the first cavity 160 or the second cavity 170. In some embodiments, the inside of the first cavity 160 or the inside of the second cavity 170 can be observed through the viewer window. In some embodiments, the semiconductor structure 100 is a microfluid biosensor system for sensing configured antigen-antibody binding. In some embodiments, the semiconductor structure 100 is a MEMS structure configured for sensing movement, pressure or etc. In some embodiments, the semiconductor structure 100 is configured for sensing linear motion and angular motion. In some embodiments, the semiconductor structure 100 includes one or more sensing devices. In some embodiments, the semiconductor structure 100 is in dual or multiple cavity pressures, as the sensing devices are operated under more than one cavity pressures. In some embodiments, the first substrate 110, the second substrate 120 and the third substrate 130 are assembled to form a hermetic or non-hermetic package system.

In some embodiments, the first substrate 110 includes a base substrate 101. In some embodiments, the base substrate 101 may be any silicon or non-silicon substrate. In some embodiments, the base substrate 101 may be a non-silicon substrate. In some embodiments, the base substrate 101 may be a transparent substrate, for example a glass substrate. In some embodiments, the base substrate 101 may be an optically transparent substrate made of glass, quartz, polymer or other materials permit light passing through. In some embodiments, the base substrate 101 may be a Pyrex glass substrate.

In some embodiments, the base substrate 101 may be a semiconductor substrate, such as a bulk semiconductor substrate. The bulk semiconductor substrate includes an elementary semiconductor, such as silicon or germanium; a compound semiconductor, such as silicon germanium, silicon carbide, gallium arsenic, gallium phosphide, indium phosphide, or indium arsenide; or combinations thereof. In some embodiments, the base substrate 101 includes a multilayered substrate, such as a silicon-on-insulator (SOI) substrate, which includes a bottom semiconductor layer, a buried oxide layer (BOX) and a top semiconductor layer. In some embodiments, the base substrate 101 includes several circuitries and one or more active elements such as transistors etc. disposed over or in the base substrate 101. In some embodiments, the circuitries formed over or in the base substrate 101 may be any type of circuitries suitable for a particular application. In accordance with some embodiments, the circuitries may include various n-type metal-oxide semiconductor (NMOS) and/or p-type metal-oxide semiconductor (PMOS) devices such as transistors, capacitors, resistors, diodes, photo-diodes, fuses and/or like. The circuitries may be interconnected to perform one or more functions. In some embodiments, the base substrate 101 is also referred to as CMOS substrate and includes CMOS components disposed over or in the base substrate 101. In some embodiments, the base substrate 101 is a CMOS substrate.

In some embodiments, a plurality of active devices (not labeled) including transistor devices such as CMOS devices is formed in proximity to a surface of the base substrate 101. In some embodiments, the active devices are a portion of active circuitry configured to perform calculations or execute procedures based on signals received from a MEMS device, for example 122 shown in FIG. 1.

In some embodiments, the first substrate 110 further includes an interconnection layer 102. In some embodiments, the interconnection layer 102 is disposed on a first surface 101a of the base substrate 101 and configured to electrically couple to the active devices. In some embodiments, the interconnection layer 102 includes metallization layer(s) (not labeled) and dielectric layer(s) (not labeled) stacking to one another. In some embodiments, the metallization layer may include metallic materials such as copper, aluminum, or conductive polymers, alloy such as aluminum copper (AlCu), or other suitable conductive materials. In some embodiments, the dielectric layer may include inter-layered dielectrics or inter-metal dielectrics, which may include low-k dielectric layers, ultra low-k layers, non-low-k dielectric layers such as passivation layers, or the like. In some embodiments, the interconnection layer 102 may further include vias (not labeled), which may be formed of metal such as copper, aluminum, tungsten, or other suitable conductive materials, formed in the dielectric layer to electrically couple the metallization layer.

In some embodiments, the first substrate 110 further includes a passivation layer 103. In some embodiments, the passivation layer 103 is formed on a top surface 102a of the interconnection layer 102. In some embodiments, the passivation layer 103 is patterned to form various openings. In some embodiments, the passivation layer 103 is a sidewall of the first cavity 160 or the second cavity 170. In some embodiments, the passivation layer 103 can be made of oxide materials. In some embodiments, the passivation layer 103 may be made of silicon oxide such as Tetraethyl orthosilicate (TEOS). In some embodiments, the passivation layer 103 is deposited on the top surface 102a of the interconnection layer 102 by a suitable process such as chemical vapor deposition (CVD). In some embodiments, the passivation layer 103 may additionally or alternatively include other suitable dielectric layer.

In some embodiments, the first substrate 110 further includes various metal pads 114. In some embodiments, the various metal pads 114 are formed on the top surface 102a of the interconnection layer 102 by a suitable technique such as deposition and patterning. In some embodiments, the metal pads 114 are configured as sensing electrodes. For example, the metal pads 114 are configured to induce a variable capacitance or resistance in response to changes of data that is being measured. In some embodiments, the sensed electrical properties, such as current or voltage, are transmitted to a data collection unit or signal processing unit in the base substrate 101 through the interconnection layer 102. For example, the metal pads 114 are configured to provide the sensing data to the base substrate 101 via the metallization layer(s). In some embodiments, the metal pads 114 are disposed over the interconnection layer 102. In some embodiments, the materials of the metal pads 114 may include metallic materials such as copper, aluminum, gold, germanium, tin, indium or other suitable conductive materials.

In some embodiments, the first substrate 110 further includes various conductors 116. The conductors 116 are disposed over the interconnection layer 102. In some embodiments, the conductors 116 are electrically coupled to the vias (not labeled) of the interconnection layer 102. In some embodiments, the materials of the conductors 116 may include metallic materials such as copper, aluminum, gold, germanium, tin, indium or other suitable conductive materials. The conductors 116 may be configured as internal or external terminals. In some embodiments, a portion of the conductors 116 may be bonded to the second substrate 120 by any suitable bonding methods such as eutectic bonding, fusion bonding, or solid-liquid inter-diffusion bonding (SLID). In some embodiments, a portion of the conductors 116 may be bonded to external circuitries. In some embodiments, the conductors 116 are surrounded by the passivation layer 103. In some embodiments, as shown in FIG. 1, the conductors 116 are protruding from the top surface 102a of the interconnection layer 102. In some embodiments, the first substrate 110 includes the base substrate 101 and the interconnection layer 102. In some embodiments, the first substrate 110 includes the base substrate 101, the interconnection layer 102, the passivation layer 103, the metal pads 114 and the conductors 116.

In some embodiments, the second substrate 120 is disposed over the first substrate 110. In some embodiments, the second substrate 120 is bonded to the first substrate 110 from a first surface 120a of the second substrate 120. In some embodiments, the second substrate 120 is bonded to the first substrate 110 by fusion bonding. In some embodiments, the second substrate 120 is directly bonded to the top surface 102a of the interconnection layer 102 by any suitable bonding methods such as eutectic bonding, fusion bonding, or solid-liquid inter-diffusion bonding (SLID). In some embodiments, the second substrate 120 is disposed on the passivation layer 103. Therefore, the fusion bonding is achieved between silicon and silicon oxide. In some embodiments, the second substrate 120 includes semiconductive material. In some embodiments, the second substrate 120 includes same material that is used for the first substrate 110. In some embodiments, the second substrate 120 includes material different from that of the first substrate 110. In some embodiments, the second substrate 120 includes silicon or other suitable materials. In some embodiments, the second substrate 120 includes electrical circuits formed over or in the second substrate 120. In some embodiments, the second substrate 120 includes transistors, capacitors, resistors, diodes, photo-diodes and/or the like. In some embodiments, the second substrate 120 is a MEMS substrate including electro-mechanical elements. In some embodiments, the second substrate 120 has a thickness T1 in a range from about 10 µm to about 725 µm.

In some embodiments, the second substrate 120 includes one or more motion sensors or other MEMS devices and therefore also referred to as MEMS substrate. A first device 122 is disposed between the first substrate 110 and the third substrate 130. In some embodiments, the first device 122 is a MEMS device. In some embodiments, the first device 122 is connected to the second substrate 120. In some embodiments, the first device 122 or at least a portion of the first device 122 may be part of the second substrate 120. In some embodiments, the first device 122 includes, for example, a microphone, a gas pressure sensor, an accelerometer, a gyroscope, a magnetometer, resonator or any other device that interfaces with the external environment. In some embodiments, the first device 122 is an accelerometer for measuring linear acceleration. In some embodiments, the first device 122 is movable relative to the first substrate 110 or the second substrate 120.

In some embodiments, the semiconductor structure 100 includes the third substrate 130 bonded to the second substrate 120 from a second surface 120b of the second substrate 120 and provide an enclosed space for the first device 122 and provide protection thereto. In some embodiments, the third substrate 130 may be a non-silicon substrate. In some embodiments, the third substrate 130 may be a transparent substrate, for example a glass substrate. In some embodiments, the third substrate 130 may be an optically transparent substrate made of glass, quartz, polymer or other materials permit light passing through. In some embodiments, the third substrate 130 may be a Pyrex glass substrate. In some embodiments, the third substrate 130 is patterned to form recessed regions aligned with the first device 122. In some embodiments, the third substrate 130 is directly bonded to the second substrate 120 by fusion bonding. The fusion bonding is achieved between the silicon substrate and the glass substrate. In some embodiments, the third substrate 130 is thinned to have a thickness T2 in a range from about 100 µm to 725 µm. In some embodiments, the third substrate 130 is a transparent substrate such that the motion of the first device 122 can be observed through the third substrate 130.

In some embodiments, as shown in FIG. 1, the second substrate 120 and the third substrate 130 are bonded together by a bonding layer 140 through fusion bonding. In some embodiments, the second substrate 120 is a silicon substrate made of silicon and the third substrate 130 is a glass substrate made of silicon dioxide ($SiO_2$). In some embodiments, the fusion bonding may be between silicon and $SiO_2$. For example, if the fusion bonding is between silicon and $SiO_2$, the bonding layer 140 is made of $SiO_2$. In some embodiments, the bonding layer 140 may be formed on the second surface 120b of the second substrate 120 to bond with a front side surface 130a of the third substrate 130. In some embodiments, the fusion bonding is between silicon and $SiO_2$ and the surfaces of silicon and $SiO_2$ are hydrophilic. The silicon and $SiO_2$ surfaces of the second substrate 120 and the third substrate 130 are then pressed together and annealed at a temperature in a range from about 100° C. to about 500° C. In some embodiments, the bonding layer 140 has a thickness in a range from about 0.5 KÅ to about 10 KÅ.

In some embodiments, as shown in FIG. 1, the second substrate 120 and the third substrate 130 are hermetically bonded, thereby defining a cavity 160, in which the first device 122 is sealed. In some embodiments, the second substrate 120 and the third substrate 130 are bonded, thereby defining a second cavity 170 in which another MEMS device may be deposited. In some embodiments, the second cavity 170 is an empty space such that light can pass though from the third substrate 130 to the first substrate 110. In some embodiments, the first cavity 160 is hermetically isolated from the second cavity 170. In some embodiments, the first cavity 160 surrounds the first device 122 and the first device 122 is movable within the first cavity 160.

Figure 2:
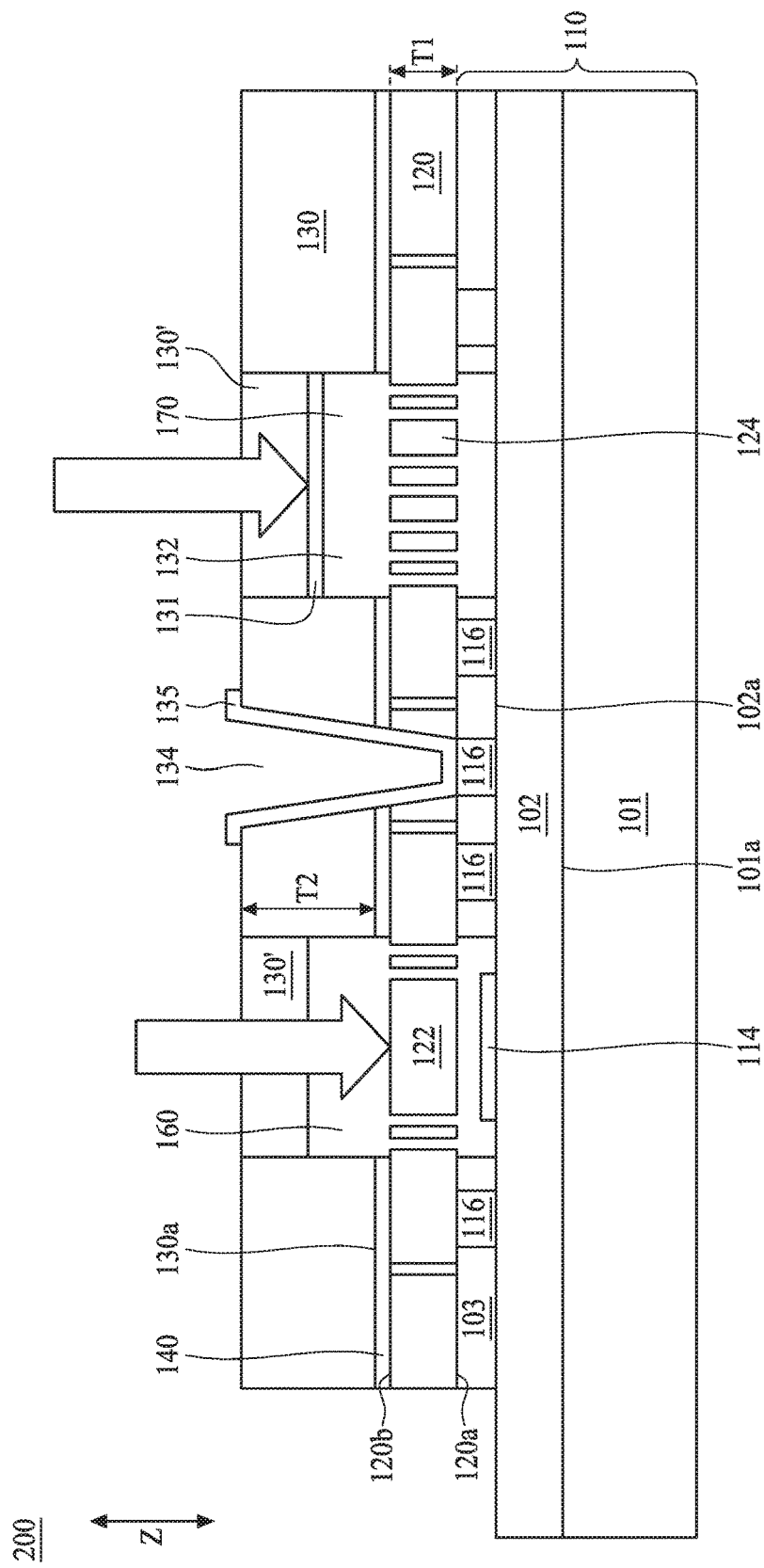
FIG. 2 is a schematic cross-sectional view of a semiconductor structure in accordance with some embodiments of the present disclosure.

FIG. 2 illustrates a semiconductor structure 200 in accordance with various embodiments of the present disclosure. FIG. 2 is a cross-sectional view of the semiconductor structure 200. In some embodiments, the semiconductor structure 200 includes a first substrate 110, an interconnection layer 102, a passivation layer 103, a second substrate 120, a third substrate 130, a bonding layer 140, a first cavity 160, a second cavity 170 and a viewer window 130' provided in the third substrate 130, which have similar configuration as described above or illustrated in FIG. 1 of the semiconductor structure 100. In some embodiments, the semiconductor structure 200 is a MEMS structure configured for sensing movement, pressure or etc. In some embodiments, the semiconductor structure 200 includes one or more sensing devices. In some embodiments, the semiconductor structure 200 is in dual or multiple cavity pressures, as the sensing devices are operated under more than one cavity pressures.

In some embodiments, as shown in FIG. 2, the second substrate 120 includes a first device 122 and a second device 124. In some embodiments, the first device 122 and the second device 124 are MEMS devices. In some embodiments, the first device 122 and the second device 124 are connected to the second substrate 120. In some embodiments, the first device 122 or at least a portion of the first device 122 may be part of the second substrate 120. In some embodiments, the first device 122 or the second device 124 includes, for example, a microphone, a gas pressure sensor, an accelerometer, a gyroscope, a magnetometer, resonator, a proof mass or any other device that interfaces with the external environment. In some embodiments, the first device 122 is an accelerometer for measuring linear acceleration. In some embodiments, the second device 124 is a gyroscope for measuring angular velocity. In some embodiments, the first device 122 and the second device 124 are cooperated to be a motion sensor. For example, the first device 122 and the second device 124 are configured for a motion-activated user interface or for an automotive crash detection system. In some embodiments, the first device 122 or the second device 124 is movable relative to the first substrate 110 or the third substrate 130. In some embodiments, the second device 124 is a sensor for monitoring the hermeticity of the second cavity 170. In some embodiments, the sensor is a Pirani gauge for monitoring the cavity pressure of the second cavity 170. In some embodiments, the movement of the first device 122 or the second device 124 can be observed through the viewer window 130'.

In some embodiments, a getter material 131 is deposited on an inner surface of a first recess 132 of the third substrate 130. In some embodiments, the getter material 131 can be deposited as a thin film. In some embodiments, the getter material 131 is activated to absorb residual gas or moisture in the second cavity 170 and decrease the pressure or humidity within the second cavity 170. In some embodiments, a thickness of the getter material 131 is less than 10 μm. In some embodiments, the getter material 131 is made of a non-conducting material. In some embodiments, the getter material 131 is made of a molecular sieve. In some embodiments, the molecular sieve includes zeolites, either naturally or synthetic. In some embodiments, the zeolite has the ability to absorb water molecules. Such zeolites include $Na_2O$, $Al_2O_3$ and $SiO_2$. In some embodiments, other suitable getter materials are used in the getter material 131. In some embodiments, the getter material 131 can include color-change indicators. In some embodiments, the color-change indicators monitor humidity in the second cavity 170 from blue to pink if the humidity atmosphere reaches unsafe levels. In some embodiments, the color of the getter material 131 will change if the getter material 131 absorbs residual moisture in the second cavity 170 so that the humidity of the second cavity 170 can be monitored by the color changes of the getter material 131 through the viewer window 130'.

In some embodiments, the semiconductor structure 200 further includes a through substrate via (TSV) 134 formed in the third substrate 130, a bonding layer 140 and the second substrate 120. In some embodiments, the TSV 134 penetrate through the third substrate 130, the bonding layer 140 and the second substrate 120 and contacts with the conductors 116 of the first substrate 110. In some embodiments, a TSV metal layer 135 is sputtered on the TSV 134. In some embodiments, the TSV 134 connects to the conductors 116 of the first substrate 110 and forms conductive paths to electrically couple the first device 122 or the second device 124 to the interconnection layer 102 of the first substrate 110.

In the present disclosure, a method of manufacturing a semiconductor structure is also disclosed. In some embodiments, a semiconductor structure is formed by a method 300. The method 300 includes a number of operations and the description and illustration are not deemed as a limitation as the sequence of the operations.

Figure 3:
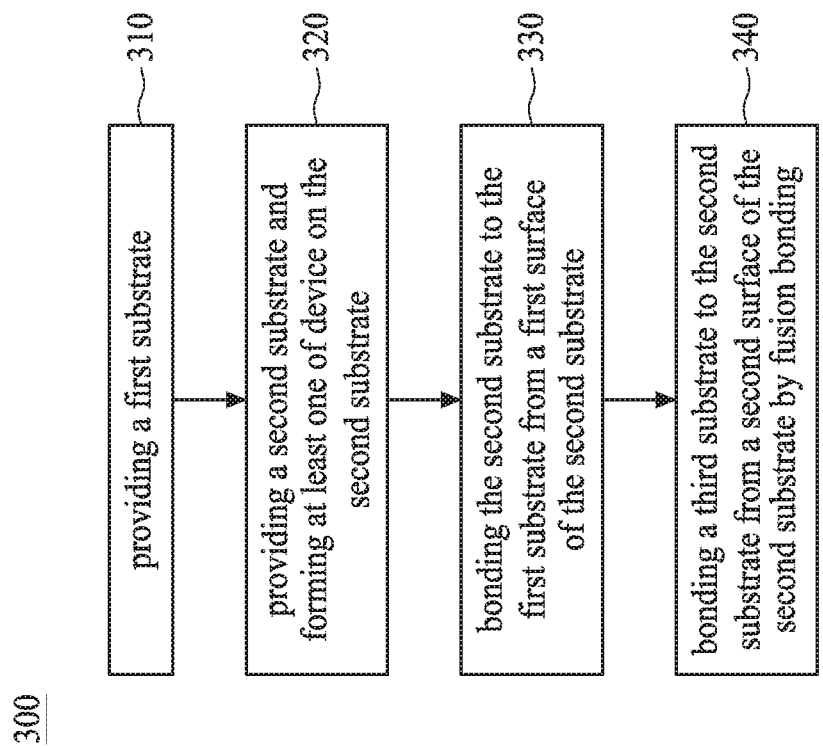
FIG. 3 is a flow diagram of a method of manufacturing a semiconductor structure in accordance with some embodiments of the present disclosure.

FIG. 3 is a flow chart illustrating a method for manufacturing a semiconductor structure according to various aspects of the present disclosure. The method 300 begins with operation 310 in which a first substrate is provided. The method 300 proceeds with operation 320 in which a second substrate is provided and at least one of device is formed on the second substrate. The method 300 continues with operation 330 in which the second substrate is bonded to the first substrate from a first surface of the second substrate. The method 300 continues with operation 340 in which a third substrate is bonded to the second substrate from a second surface of the second substrate by fusion bonding.

Figure 3A:
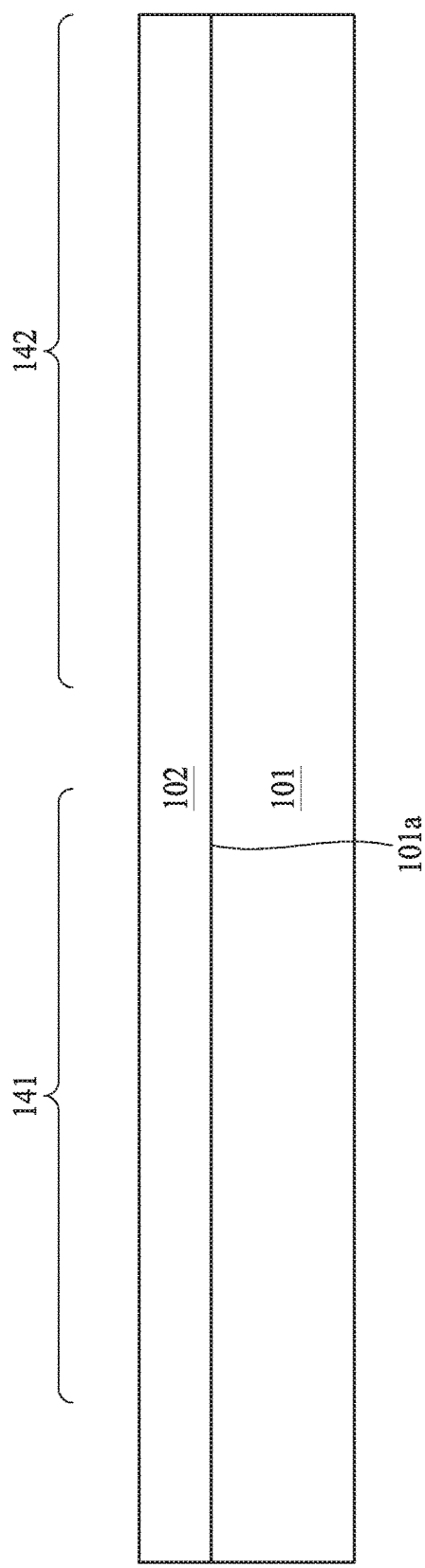
FIGS. 3A-3H are schematic cross-sectional views at one of various operations of manufacturing device according to some embodiments of the present disclosure.

FIGS. 3A-3H are cross-sectional views at one of various operations of manufacturing a semiconductor structure according to some embodiments of the present disclosure. As depicted in FIG. 3A and operation 310 in FIG. 3, a base substrate 101 is received or provided. In some embodiments, the base substrate 101 includes a first region 141 and a second region 142 configured to form different MEMS devices respectively. A plurality of active devices (not labeled) such as CMOS devices is formed in proximity to a surface of the base substrate 101. In some embodiments, the base substrate 101 may be any silicon or non-silicon substrate. In some embodiments, the base substrate 101 may be a non-silicon substrate. In some embodiments, the base substrate 101 may be a transparent substrate, for example a glass substrate. In some embodiments, the base substrate 101 may be an optically transparent substrate made of glass, quartz, polymer or other materials permit light passing through. In some embodiments, the base substrate 101 may be a semiconductor substrate, such as a bulk semiconductor substrate.

Referring to FIG. 3A, an interconnection layer 102 is formed over the base substrate 101 and electrically coupled to the active devices. In some embodiments, the interconnection layer 102 is formed on a top surface 101a of the base substrate 101. In some embodiments, the interconnection layer 102 includes metallization layer(s) (not labeled), dielectric layer(s) (not labeled), vias (not labeled) and conductive vias (not labeled). In some embodiments, conductive vias electrically connect the exposed metallization layer(s).

Figure 3B:
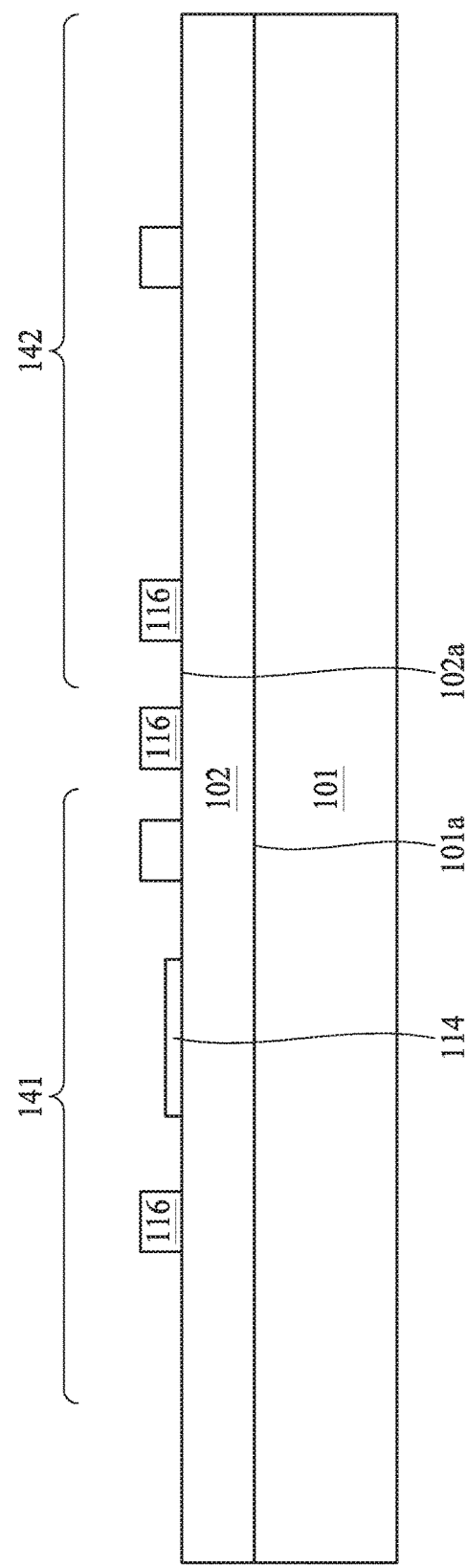

As depicted in FIG. 3B, various metal pads 114 and various conductors 116 are formed on a top surface 102a of the interconnection layer 102. In some embodiments, the metal pads 114 are configured as sensing electrode while the conductors 116 are used for bonding with overlaying structures. In some embodiments, the conductive vias of the interconnection layer 102 electrically couple the metal pads 114 or the conductors 116 and the metallization layer(s) of the interconnection layer 102. In some embodiments, the metal pads 114 or the conductors 116 are formed by depositing a metal layer on the interconnection layer 102 and pattering the metal layer with lithography. In some embodiments, the materials of the metal pads 114 and the conductors 116 may include metallic materials such as copper, aluminum, gold, germanium, tin, indium or other suitable conductive materials. In some embodiments, the metal pads 114 are configured to induce a variable capacitance or resistance in response to changes of data that is being measured. In some embodiments, the conductors 116 are configured to receive an interconnect structure or electrically connect with external circuitry or conductive element. In some embodiments, a portion of the conductors 116 may be bonded to another substrates e.g., MEMS substrates by any suitable bonding methods such as eutectic bonding, fusion bonding, or solid-liquid inter-diffusion bonding (SLID). In some embodiments, a portion of the conductors 116 may be bonded to external circuitries.

Figure 3C:
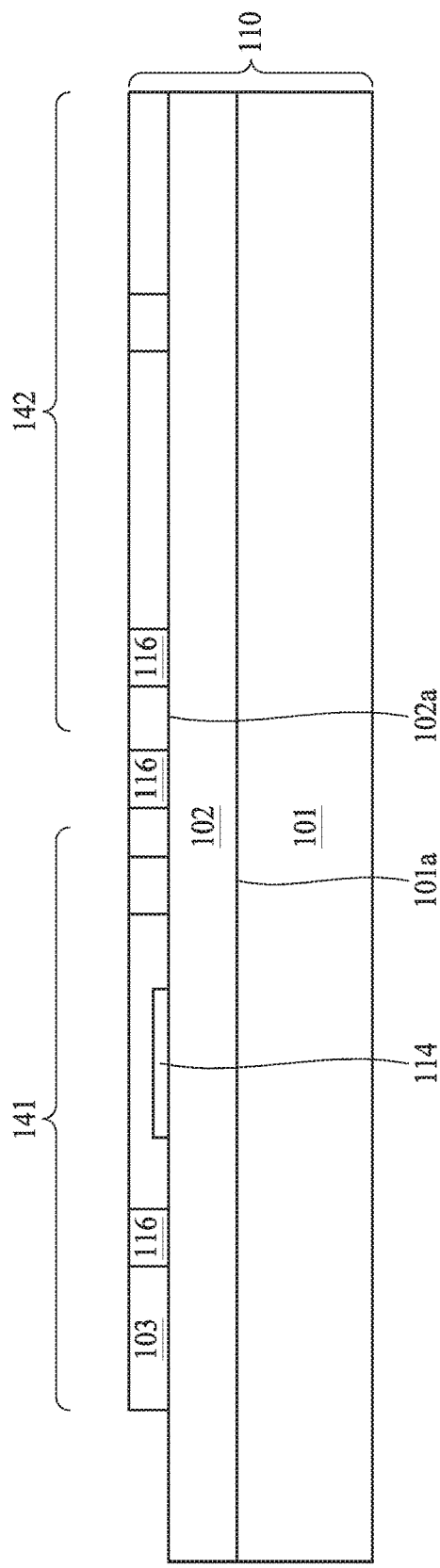

As depicted in FIG. 3C, a passivation layer 103 is formed to fill gaps between the metal pads 114 and the conductors 116 by chemical vapor deposition (CVD) or other suitable operations. Then, a portion of the passivation layer 103 is removed to reduce the as-deposition total thickness of the passivation layer 103 to a predetermined value by using a chemical mechanical polishing (CMP) operation, an etch operation, or combinations thereof. In some embodiments, the passivation layer 103 is removed to form flat surface for the fusion bonding interface.

In some embodiments, the passivation layer 103 can be made of oxide materials. In some embodiments, the passivation layer 103 may be made of silicon oxide such as Tetraethyl orthosilicate (TEOS). In some embodiments, the passivation layer 103 is deposited on the top surface 102a of the interconnection layer 102 by a suitable process such as chemical vapor deposition (CVD). In some embodiments, the passivation layer 103 may additionally or alternatively include other suitable dielectric layer. In some embodiments, the first substrate 110 includes the base substrate 101, the interconnection layer 102, the passivation layer 103, the metal pads 114 and the conductors 116.

Figure 3D:
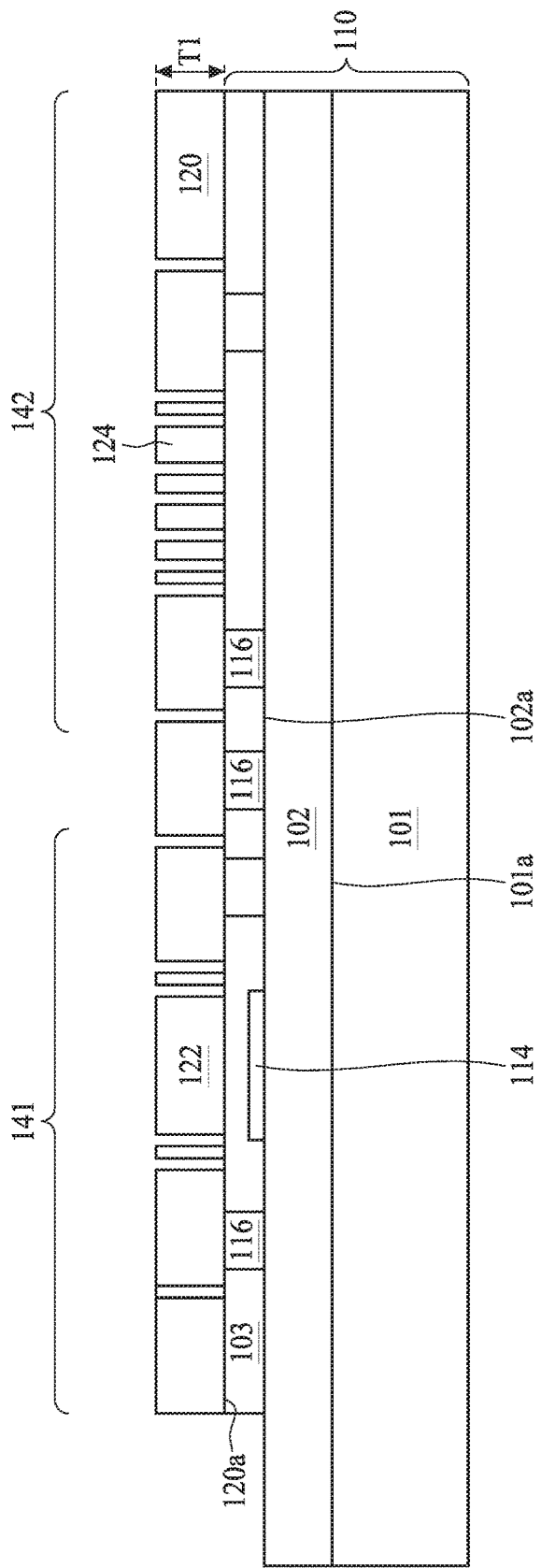

As depicted in FIG. 3D and operation 320 in FIG. 3, a second substrate 120 is received or provided. In some embodiments, the second substrate 120 is disposed over the first substrate 110. In some embodiments, the second substrate 120 is bonded to the first substrate 110 from a first surface 120a of the second substrate 120. In some embodiments, the second substrate 120 is bonded to the first substrate 110 by fusion bonding. In some embodiments, the second substrate 120 is disposed on the passivation layer 103. In some embodiments, the second substrate 120 is fusion bonded with the passivation layer 103 from a first surface 120a of the second substrate 120. In some embodiments, the second substrate 120 includes semiconductive materials. In some embodiments, the second substrate 120 includes silicon or other suitable materials. In some embodiments, the second substrate 120 includes electrical circuits formed over or in the second substrate 120. In some embodiments, the second substrate 120 is a MEMS substrate including electro-mechanical elements. In some embodiments, the second substrate 120 is patterned to form a first device 122 and a second device 124. The second substrate 120 may be patterned by any suitable patterning methods such as etching.

Referring to FIG. 3D, in some embodiments, the second substrate 120 includes one or more device such as the first device 122 or the second device 124. In some embodiments, the second substrate 120 includes the first device 122 and the second device 124. In some embodiments, the first device 122 and the second device 124 are MEMS devices. In some embodiments, the first device 122 is an accelerometer for measuring linear acceleration. In some embodiments, the second device 124 is a gyroscope for measuring angular velocity. In some embodiments, the second substrate 120 is grinded or removed to reduce the as-deposition total thickness of the second substrate 120 to a predetermined value by using a chemical mechanical polishing (CMP) operation, an etch operation, or combinations thereof. In some embodiments, the second substrate 120 is removed to form flat surface for the fusion bonding interface. In some embodiments, the second substrate 120 is grinded to have a thickness T1 in a range from about 10 µm to 725 µm. In some embodiments, the second substrate 120 is grinded to have a thickness T1 of 30 µm.

Figure 3E:
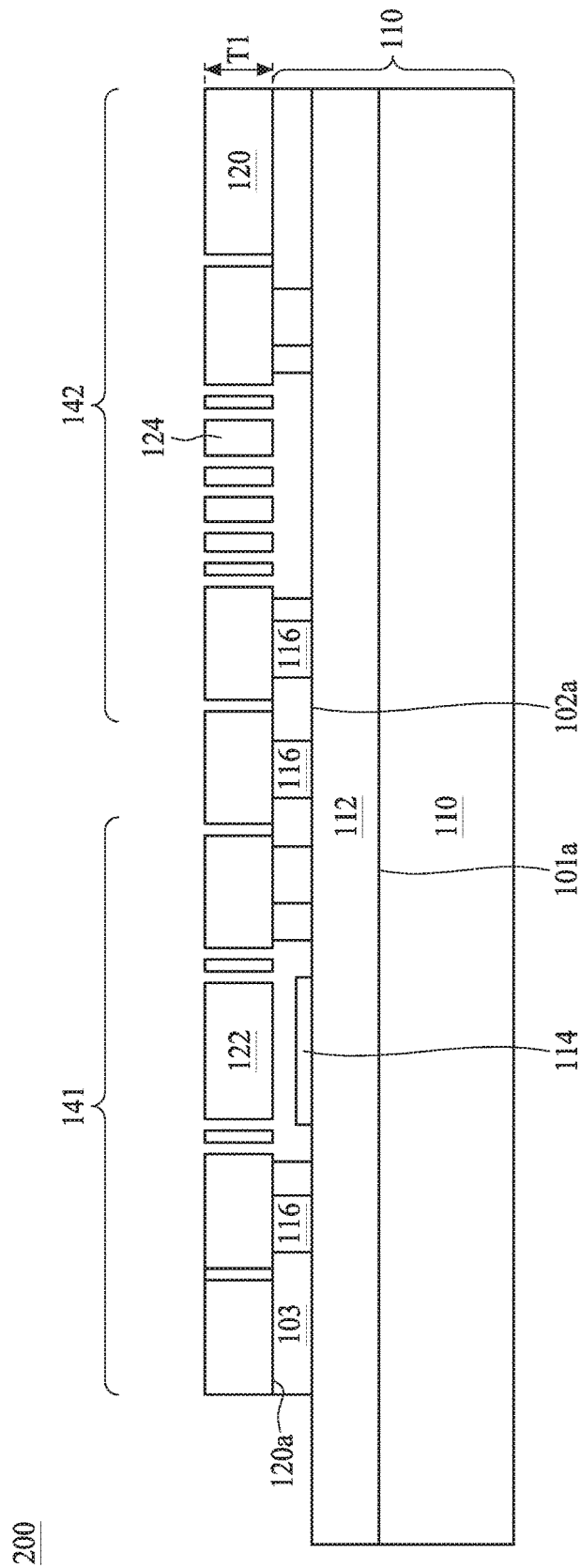

As depicted in FIG. 3E, in some embodiments, the passivation layer 103 is then patterned and etched to form various recesses (not labeled). In some embodiments, a portion of passivation layer 103 both in the first region 141 and the second region 142 are removed by an etch operation. In some embodiments, the etch operation in the present embodiment includes reactive ion etch (RIE) adopting fluorine-containing gases. The etch operation is conducted using a suitable etchant, such as fluorine-containing gases or $CF_4$, $CHF_3$, $CH_2F_2$, Ar, $N_2$, $O_2$ and He.

Figure 3F:
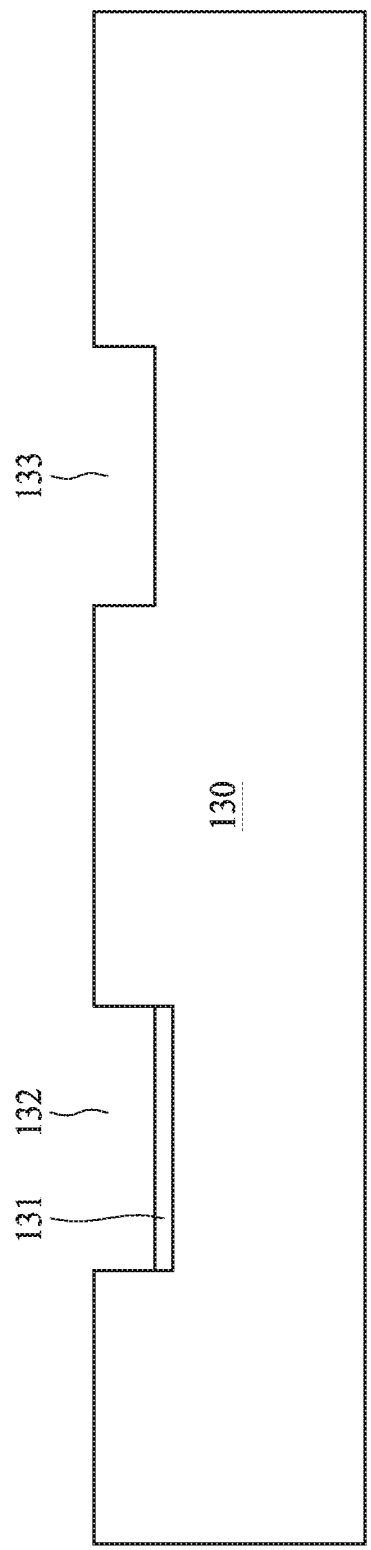

As depicted in FIG. 3F, the third substrate 130 is received. In some embodiments, the third substrate 130 may be a non-silicon substrate. In some embodiments, the third substrate 130 may be a transparent substrate, for example a glass substrate. In some embodiments, the third substrate 130 may be an optically transparent substrate made of glass, quartz, polymer or other materials permit light passing through. In some embodiments, the third substrate 130 may be a Pyrex glass substrate. Referring to FIG. 3F, the third substrate 130 includes a first recess 132 and a second recess 133. In some embodiments, the first recess 132 and the second recess 133 are formed by removing some portions of the third substrate 130. In some embodiments, the first recess 132 and the second recess 133 are formed by any suitable operations, such as drilling, milling, etching, laser treatment or combinations thereof.

Referring to FIG. 3F, a getter material 131 is patterned and deposited on an inner surface of the first recess 132 of the third substrate 130. In some embodiments, the getter material 131 may be thin-film sputtered or deposited on a desired location on an inner surface of the first recess 132 of the third substrate 130. In some embodiments, the getter material 131 is made of a molecular sieve. In some embodiments, the molecular sieve includes zeolites, either naturally or synthetic. In some embodiments, the zeolite has the ability to absorb water molecules. Such zeolites include $Na_2O$, $Al_2O_3$ and $SiO_2$. In some embodiments, other suitable getter materials are used in the getter material 131. In some embodiments, the getter material 131 may include color-change indicators.

Figure 3G:
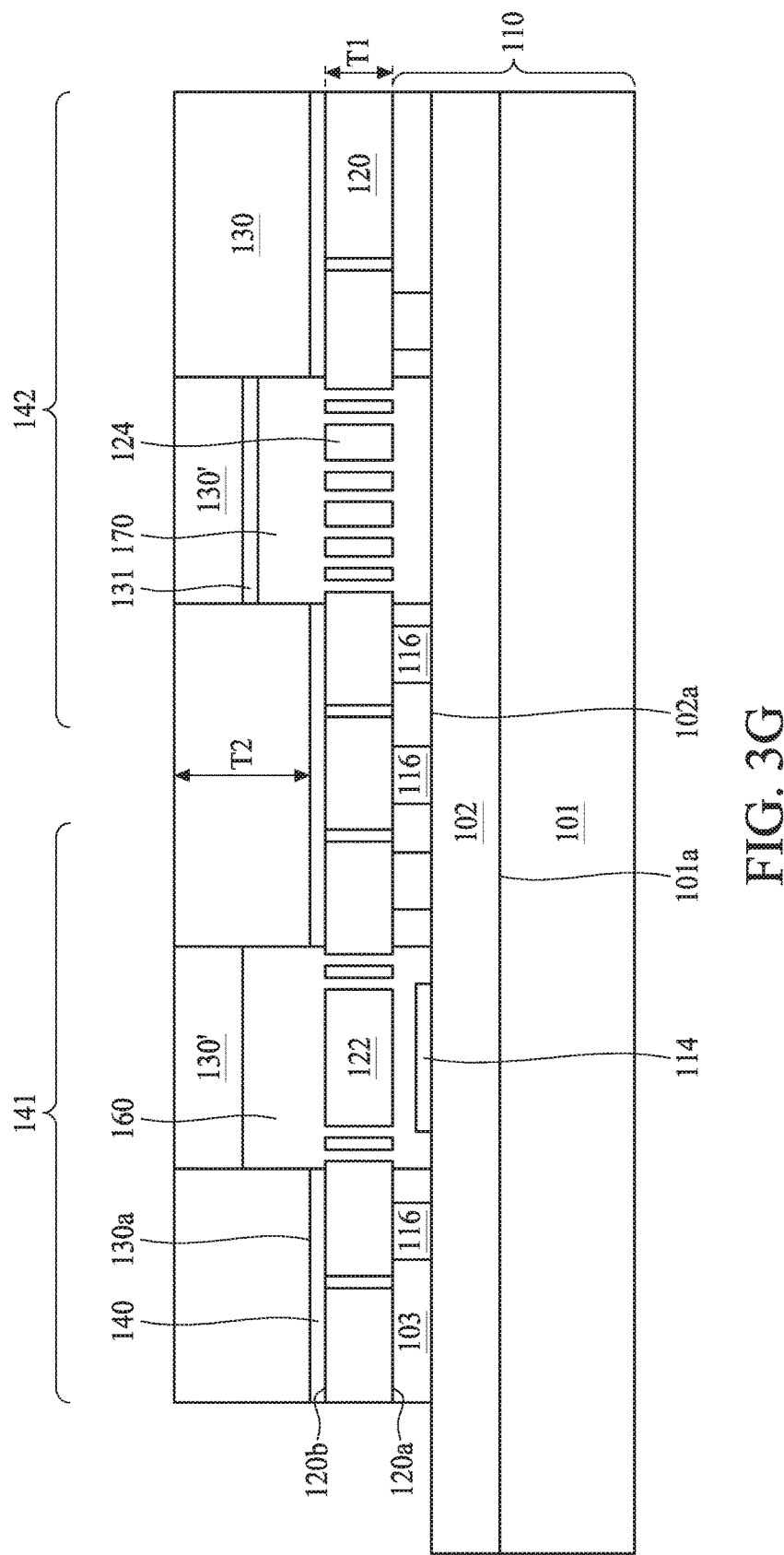

As depicted in FIG. 3G and operation 340 in FIG. 3, in some embodiments, the third substrate 130 is directly bonded to the second substrate 120 by fusion bonding. In some embodiments, the third substrate 130 is bonded to the second substrate 120 from a second surface 120b of the second substrate 120. In some embodiments, the fusion bonding is achieved between the silicon substrate, such as the second substrate 120, and the glass substrate, such as the third substrate 130. In some embodiments, the third substrate 130 is grinded and thinned to have a desired thickness. In some embodiments, the third substrate 130 is grinded to a thickness T2 in a range from about 100 µm to 725 µm. In some embodiments, the third substrate 130 is a transparent substrate such that the motion of the first device 122 can be observed through the third substrate 130.

Referring to FIG. 3G, in some embodiments, a first cavity 160 and a second cavity 170 are formed when the third substrate 130 is disposed over the second substrate 120. In some embodiments, the first device 122 is disposed within the first cavity 160, and the second device 124 is disposed within the second cavity 170. In some embodiments, the first cavity 160 is insulated from the second cavity 170.

Referring to FIG. 3G, after the fusion bonding has been initiated by contacting the third substrate 130 with the second substrate 120, a heating operation may be introduced to the third substrate 130 and the second substrate 120. In some embodiments, the heating operation may be performed by annealing the third substrate 130 and the second substrate 120 at a temperature of between about 100° C. and about 500° C. In some embodiments, the second substrate 120 and the third substrate 130 are bonded together by a bonding layer 140 through fusion bonding. In some embodiments, the second substrate 120 is a silicon substrate made of silicon and the third substrate 130 is a glass substrate made of silicon dioxide ($SiO_2$). In some embodiments, the fusion bonding may be between silicon and $SiO_2$. For example, if the fusion bonding is between silicon and $SiO_2$, the bonding layer 140 is made of $SiO_2$. In some embodiments, the bonding layer 140 may be formed on the second surface 120b of the second substrate 120 to bond with a front side surface 130a of the third substrate 130. In some embodiments, the fusion bonding is between silicon and $SiO_2$ and the surfaces of silicon and $SiO_2$ are hydrophilic. The silicon and $SiO_2$ surfaces of the second substrate 120 and the third substrate 130 are then pressed together and annealed at a temperature in a range from about 100° C. to about 500° C.

Figure 3H:
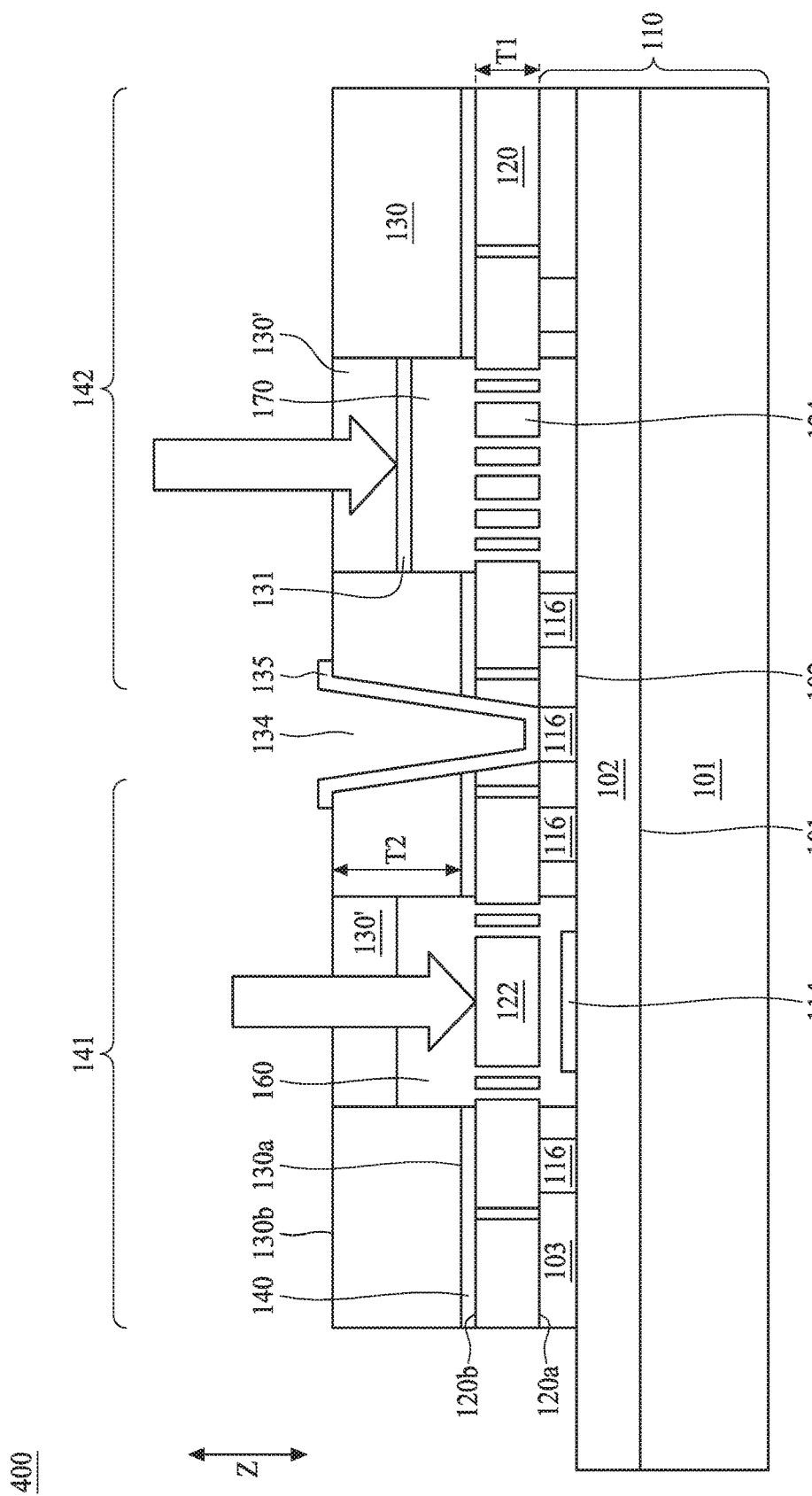

As depicted in FIG. 3H, after the third substrate 130 is thinned, a back side surface 130b of the third substrate 130 is patterned by a photoresist (not labeled) to expose surface areas for forming a TSV 134 in accordance with some embodiments. In some embodiments, the TSV 134 may be formed by a variety of techniques, e.g., ultrasonic drilling, abrasive jet micromachining (AJM), abrasive slurry jet machining (ASJM), abrasive water jet machining (AWJM), laser machininh, and the like. In some embodiments, the back side surface 130b of the third substrate 130 is thinned to make TSV 134 having shorter heights to avoid the aspect ratio of the TSV 134 being too high. In some embodiments, the TSV 134 formed in the third substrate 130, a bonding layer 140 and the second substrate 120. In some embodiments, the TSV 134 penetrates through the third substrate 130, the bonding layer 140 and the second substrate 120 and contacts with the conductors 116 of the first substrate 110. In some embodiments, a TSV metal layer 135 is sputtered on the TSV 134. In some embodiments, the TSV 134 connects to the conductors 116 of the first substrate 110 and forms conductive paths to electrically couple the first device 122 or the second device 124 to the interconnection layer 102 of the first substrate 110.

As a result, a semiconductor structure 100, 200 or 400 therein is formed. In some embodiments, the semiconductor structure 400 illustrated in FIG. 3H has similar configuration as in FIG. 2.

In the present disclosure, a semiconductor structure is provided. The semiconductor structure includes a first substrate. The semiconductor structure includes a second substrate bonded to the first substrate from a first surface of the second substrate. The semiconductor structure includes a third substrate bonded to the second substrate from a second surface of the second substrate. The semiconductor structure further includes a cavity defined by the first substrate, the second substrate and the third substrate. The semiconductor structure further includes a viewer window provided in the third substrate and aligned with the cavity and the inside of the cavity is observed through the viewer window.

In the present disclosure, a semiconductor structure is provided. The semiconductor structure includes a first substrate having an interconnection layer formed therein. The semiconductor structure includes a second substrate bonded to the first substrate from a first surface of the second substrate and the second substrate includes at least one of device formed thereon. The semiconductor structure includes a third substrate bonded to the second substrate from a second surface of the second substrate and the third substrate includes at least one of recess aligned with the device. The semiconductor structure includes a viewer window provided in the third substrate and aligned with the device and the device is observed through the viewer window.

In the present disclosure, a method of manufacturing a semiconductor structure is provided. The method includes providing a first substrate, providing a second substrate and forming at least one of device on the second substrate, bonding the second substrate to the first substrate from a first surface of the second substrate and bonding a third substrate to the second substrate from a second surface of the second substrate by fusion bonding. The third substrate comprises a viewer window aligned with the device and configured to observe the device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first substrate;
a second substrate bonded to the first substrate from a first surface of the second substrate;
a third substrate bonded to the second substrate from a second surface of the second substrate;
a first cavity defined by the first substrate, the second substrate and the third substrate;
a first device disposed in the first cavity;
a second cavity defined by the first substrate, the second substrate and the third substrate, and separated from the first cavity;
a second device disposed in the second cavity;
a first viewer window provided in the third substrate and aligned with the first cavity; and
a second viewer window provided in the third substrate and aligned with the second cavity,
wherein the inside of the first cavity is observed through the first viewer window, and the first device and the second device are different devices.

2. The semiconductor structure of claim 1, wherein the first substrate further comprises a passivation layer.

3. The semiconductor structure of claim 1, wherein the second substrate is fusion bonded to the third substrate.

4. The semiconductor structure of claim 1, further comprising at least one of device positioned in the first cavity.

5. The semiconductor structure of claim 4, wherein the device is observed through the first viewer window.

6. The semiconductor structure of claim 1, wherein the first substrate is a glass substrate or a silicon substrate.

7. The semiconductor structure of claim 1, wherein the third substrate is a glass substrate.

8. The semiconductor structure of claim 1, wherein the second substrate has a thickness in a range from about 10 μm to 725 μm.

9. The semiconductor structure of claim 1, wherein the third substrate has a thickness in a range from about 100 μm to 725 μm.

10. A semiconductor structure, comprising:
a first substrate having an interconnection layer formed therein;
a second substrate bonded to the first substrate from a first surface of the second substrate;
a third substrate bonded to the second substrate from a second surface of the second substrate;
a first cavity defined by the first substrate, the second substrate and the third substrate;
a first device disposed in the first cavity;
a second cavity defined by the first substrate, the second substrate and the third substrate, and separated from the first cavity;
a second device disposed in the second cavity;
a first viewer window provided in the third substrate and aligned with the first device; and
a second viewer window provided in the third substrate and aligned with the second device,
wherein the first device and the second device are different devices.

11. The semiconductor structure of claim 10, wherein the first substrate further comprises a passivation layer formed on the interconnection layer.

12. The semiconductor structure of claim 10, further comprising a getter material disposed on an inner surface of the first cavity or the second cavity.

13. The semiconductor structure of claim 10, further comprising a through substrate via (TSV) formed in the third substrate and the second substrate.

14. The semiconductor structure of claim 13, wherein the TSV contacts with the first substrate.

15. The semiconductor structure of claim 10, wherein the third substrate is a glass substrate.

16. The semiconductor structure of claim 10, wherein the second substrate has a thickness in a range from about 10 μm to 725 μm.

17. The semiconductor structure of claim 10, wherein the first device is an accelerometer or includes a proof mass.

18. A method of manufacturing a semiconductor structure, comprising:
providing a first substrate comprising a passivation layer;
bonding a second substrate to the first substrate from a first surface of the second substrate;
removing a portion of the passivation layer of the first substrate; and
bonding a third substrate to the second substrate from a second surface of the second substrate by fusion bonding after removing the portion of the passivation layer,
wherein the second substrate comprises at least a device and the third substrate comprises a viewer window aligned with the device and configured to observe the device.

19. The method of claim 18, wherein the first substrate comprises an interconnection layer.

20. The method of claim 18, further comprising forming a bonding layer between the second substrate and the third substrate.

* * * * *